United States Patent [19]

Steinmüller

[11] 4,254,376
[45] Mar. 3, 1981

[54] APPARATUS FOR MEASURING THE ELECTRIC POWER OR ENERGY IN AN A-C NETWORK

[75] Inventor: Günter Steinmüller, Nuremburg, Fed. Rep. of Germany

[73] Assignee: Siemens Aktiengesellschaft, Munich, Fed. Rep. of Germany

[21] Appl. No.: 949,236

[22] Filed: Oct. 6, 1978

[30] Foreign Application Priority Data

Oct. 21, 1977 [DE] Fed. Rep. of Germany ....... 2747385

[51] Int. Cl.³ .......................................... G01R 21/06
[52] U.S. Cl. .................................................. 324/142
[58] Field of Search ........................ 324/142; 364/842

[56] References Cited

U.S. PATENT DOCUMENTS

| 3,746,851 | 7/1973 | Gilbert | 324/142 X |
| 3,760,273 | 9/1973 | Burkett et al. | 324/142 |
| 3,953,795 | 4/1976 | Brunner | 324/142 |
| 3,959,724 | 5/1976 | Chana et al. | 324/142 |

FOREIGN PATENT DOCUMENTS 472677  6/1969  Switzerland ............................ 324/142

Primary Examiner—Stanley T. Krawczewicz
Attorney, Agent, or Firm—Kenyon & Kenyon

[57] ABSTRACT

An apparatus for measuring the electric power or energy in an a-c network is disclosed wherein a multiplying device operating according to the principle of pulse duration-pulse height modulation is used and the variables proportional to the load current and the load voltage are taken directly from the load current and the load voltage respectively.

10 Claims, 2 Drawing Figures ness is known from German Offenlegungsschrift No. 25 19 668. That arrangement, used for measuring electric power and energy, feeds an electrical analog variable, derived from the one measurement variable to be multiplied, to a current to frequency converter which includes an integrating stage, a monostable multivibrator and a reference voltage source. The reference D-C quantity from the voltage source is superimposed on the electrical analog variable for a time predetermined by the monostable multivibrator in such a manner that it opposes this variable and leads to the discharge of a capacitor in the integrating stage. The switching time of the monostable multivibrator is determined by an electrical analog variable derived from the second measurement variable in such a manner that the switching time is inversely proportional to the magnitude of the electrical analog variable. A charging and discharging of the capacitor of the integrating stage is thus caused. The frequency of the charging and discharging of the capacitor of the integrating stage is proportional to the product of the two electrical analog variables. In this connection, it has already been proposed that an input signal be derived from the measured current by means of a shunt or a current transformer and that the input signal derived from the measurement voltage be converted directly into a D-C voltage proportional to the latter, and the phase relation between the two measurement variables be taken into consideration by one of the known circuits.

An electronic kilowatt-hour meter with a multiplying device operating according to the principle of pulse duration-pulse height modulation is disclosed in German Auslegeschrift No. 23 48 667. This device generates a current or a voltage proportional to the product of load voltage and current. Through the use of a resistance network, the device derives two currents directly from the load voltage. The first current is proportional to the load voltage, and the second current is also proportional to the load voltage, but has a polarity opposed to that of the first current and halved instantaneous values. The first current is added to the second current during one of two switching states of a switch, which is actuated by a pulse duration-pulse height modulator controlled by the load current. The mean value of the resultant current is proportional to the product of the load current and the load voltage.

SUMMARY OF THE INVENTION

It is an object of the present invention to provide an apparatus for measuring the electric power or energy in an A-C network of the type described at the outset, which can be realized with simple conventional means and which is suitable for direct connection up to 100 Amps.

Another object of the present invention is to provide an apparatus for measuring the electric power of an A-C network which can be constructed from commercially available operational amplifiers.

The apparatus according to the present invention is characterized by the feature that the variables proportional to the load current and the load voltage are derived directly from the load current and the load voltage respectively by means of a shunt. The load current is conducted through the shunt and the voltage drop at the shunt is used as the variable proportional to the load current. The load current is fed through an operational amplifier into the inverting input of another operational amplifier connected as an oscillator having the characteristics of an astable multivibrator in such a manner that the duty cycle of the signals delivered by the oscillator is changed in accordance to the magnitude of the load current. The variable proportional to the load voltage is preferably formed by means of a resistor which is connected on one side to the neutral conductor and on the other side, via a solid-state switch, to the inverting input of the amplifier.

DETAILED DESCRIPTION OF THE INVENTION

Figure 1:
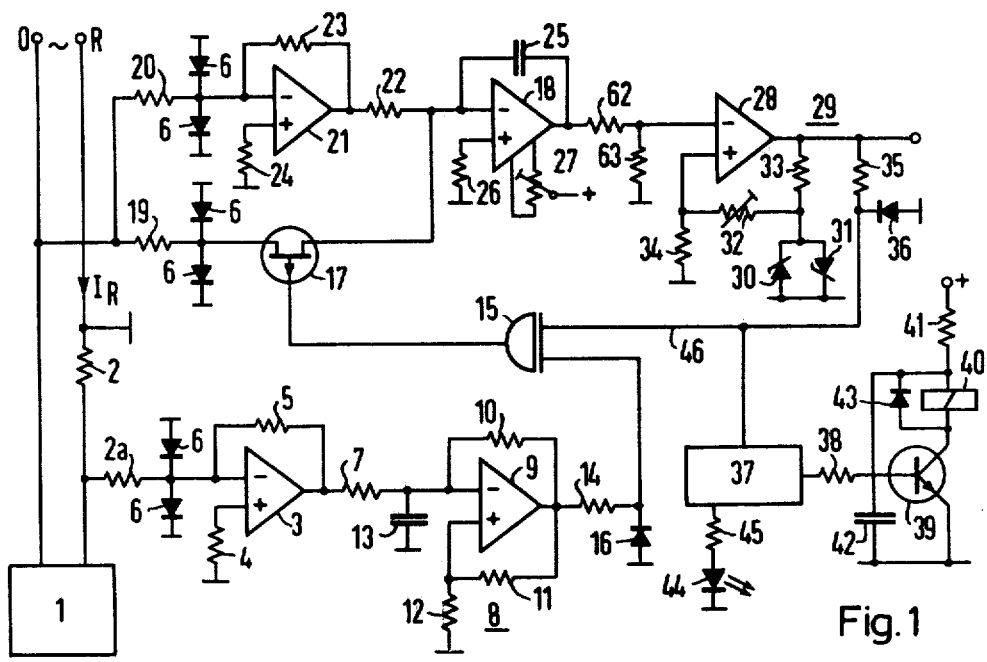
FIG. 1 shows a circuit diagram of an electronic kilowatt-hour meter, in which an integrator operating according to the principle of capacitor charge reversal is used.

One embodiment of the present invention utilizes an integrator operating according to the principle of capacitor charge reversal. Referring specifically to FIG. 1, a neutral conductor O and a phase conductor R of an A-C network are generally depicted. In the phase conductor R, which is connected to a load 1, a shunt 2 is arranged. A quantity proportional to the load current is taken off shuntz as the voltage drop. The voltage drop is fed via a resistor $2a$ to the inverting input of an operational amplifier 3. Amplifier 3 has its non-inverting input is tied via a resistor 4 to chassis potential which, however, is practically the potential of the phase R, since the other end of the shunt 2 is tied to this reference potential, as shown in FIG. 1. The output of the amplifier 3 is connected via a feedback resistor 5 to its inverting input. Through proper selection of the resistor 5, the required amplification of the voltage drop at the shunt 2 is obtained. Diodes 6 protect amplifier against overvoltages. The output of amplifier 3 is connected via a resistor 7 to an oscillator 8 including an amplifier 9 which is connected as an oscillator having the characteristics of an astable multivibrator. The output of the amplifier 9 is feedback via two resistors 10 and 11 to its inverting and non-inverting inputs, respectively. The non-inverting input is also tied to reference potential via a resistor 12. The inverting input of the amplifier 9 is further connected to one terminal of a capacitor 13 which has its other terminal at reference potential. Through proper design of the resistors 10 to 12 and the capacitor 13, the oscillator 8 oscillates at a very well defined frequency $f = 1/T$. Due to the fact that the output of the amplifier 3 is now connected via the resistor 7 to the inverting input of the amplifier 9, the duty cycle $(T_1 - T_2)/(T_1 + T_2)$ of the signals delivered by the oscillator 8 is changed in dependence on the magnitude of the load current $I_R$, where $T1+T2=T$. The output of the oscillator 8 is connected via a resistor 14 to the input of an Exclusive-OR CMOS gate 15. A diode 16 lets only one polarity reach to the input of the gate 15.

At the output of the Exclusive-OR gate 15, the signals of the oscillator 8, modulated by the magnitude of the load current, appear. These signals control a p-channel field-effect transistor 17, via which a variable proportional to the load voltage is fed to an integrating amplifier 18 for pulse-height modulation. The inverting input of integrating amplifier 18 is therefore in connection with the neutral conductor via the p-channel field-effect transistor 17 and a resistor 19. Shunted across resistor 19 and transistor 17 are a further resistor 20 of the same resistance, an inverting amplifier 21 and a resistor 22. Resistor 22 causes the current through this branch to be only half the magnitude of the current flowing through the resistor 19. In this manner, with the transistor 17 closed, the sum of the currents at the input to amplifier 18 which is as large as the current flowing through the resistors 20 and 22 with the transistor open, but with the opposite polarity, is obtained. The operational amplifier has two further resistors 23 and 24, in order to obtain the proper inverted gain.

The output of the amplifier 18 is connected to its inverting input via an integrating capacitor 25. The noninverting input is tied to reference potential via a resistor 26. A potentiometer 27 is used to balance out the offset voltages of the integrating amplifier 18. The output of the integrating amplifier 18 is connected via resistors 62 and 63 to reference potential. The junction point of the resistors is connected to the inverting input of a further operational amplifier 28 which acts as a limit stage 29. Reference diodes 30 and 31 adjust the upper and lower limit; the magnitude can be set by means of a potentiometer 32. The reference diodes 30 and 31 are connected on the one side to reference potential and, on the other side, via a resistor 33, to the output of the operational amplifier 28. The noninverting input is tied to reference potential via a resistor 34. The output of the limit stage 29 is connected via a resistor 35 and diode 36 to the input of a stepdown stage 37, e.g., a binary counter and decoder, with a step-down ratio of, for instance, 1:100, i.e., one pulse is delivered at the output of the limit stage 29 for 100 pulse changes at its imput. The output of the pulse stepdown stage 37 is connected via a resistor 38 to the base of a switching transistor 39. In series with the collector-emitter path of the switching transistor 39, a coil 40 of a pulse counter and a resistor 41 are connected to a positive D-C voltage. With the switching transistor 39 cut off, a capacitor 42 is charged through resistor 41. The capacitor 42 can then discharge via the coil 40 of the pulse counter due to the closing of the switching transistor 39 when a pulse is delivered by the stepdown stage 37. The energy for the advancing of the pulse counter is therefore essentially taken from the capacitor 42, so that a small amount of power is sufficient for the power supply of this circuit. So that the magnetic energy of the coil 40 can be equalized when the switching transistor 39 is opened, a diode 43 is provided. At the step-down stage 37 a light-emitting diode 44, which is tied to reference potential via a resistor 45, is also provided. The light-emitting diode 44 blinks with the rhythm of the pulses delivered by the limit stage 29. These pulses are also coupled, via a line 46, to the second input of the Exclusive-OR gate 15.

The operation is as follows: As already discussed before, the oscillator 8 oscillates with a well-defined frequency $f=1/T$. If a current $I_R$ flows through the shunt 2, it causes a voltage drop at the shunt 2, which is amplified by means of the operational amplifier 3 and is fed to the oscillator 8. According to this current, the charge of the capacitor 13 is changed so that the duty cycle defined by the pulse width T1 and the pulse interval T2 of the signals delivered by the oscillator 8 is changed correspondingly. In the same rhythm, the field effect transistor 17 is switched open and closed. When the field-effect transistor 17 is switched of a current flows to the capacitor 25 from the neutral conductor O via the resistor 20, the amplifier 21 and the resistor 22. If the field-effect transistor 17 is closed, then a current of opposite polarity also flows into the capacitor 25 through resistor 19, to which the current flowing through the resistors 20 and 22 is added. If the charging voltage of the capacitor 25 reaches its upper positive limit, then the limit stage 29 responds and flips into the other position, so that the output of the amplifier 28 changes its polarity accordingly whereby the Exclusive-OR gate 15 receives, via the line 46, a signal such that, at its output, the reverse polarity of the pulses coming from the oscillator 8 becomes effective for the field-effect transistor 17. This changes the direction of the charge and discharge, respectively, of the capacitor 25, so that then the other limit of the limit stage 29 is addressed. Every signal change at the resistor 35 is registered by the step-down stage 37 as a pulse and is indicated by the light-emitting diode 24. After passing through the step-down stage, the pulse counter with its coil 40 is then addressed via the transistor 39, as was explained before.

Figure 2:
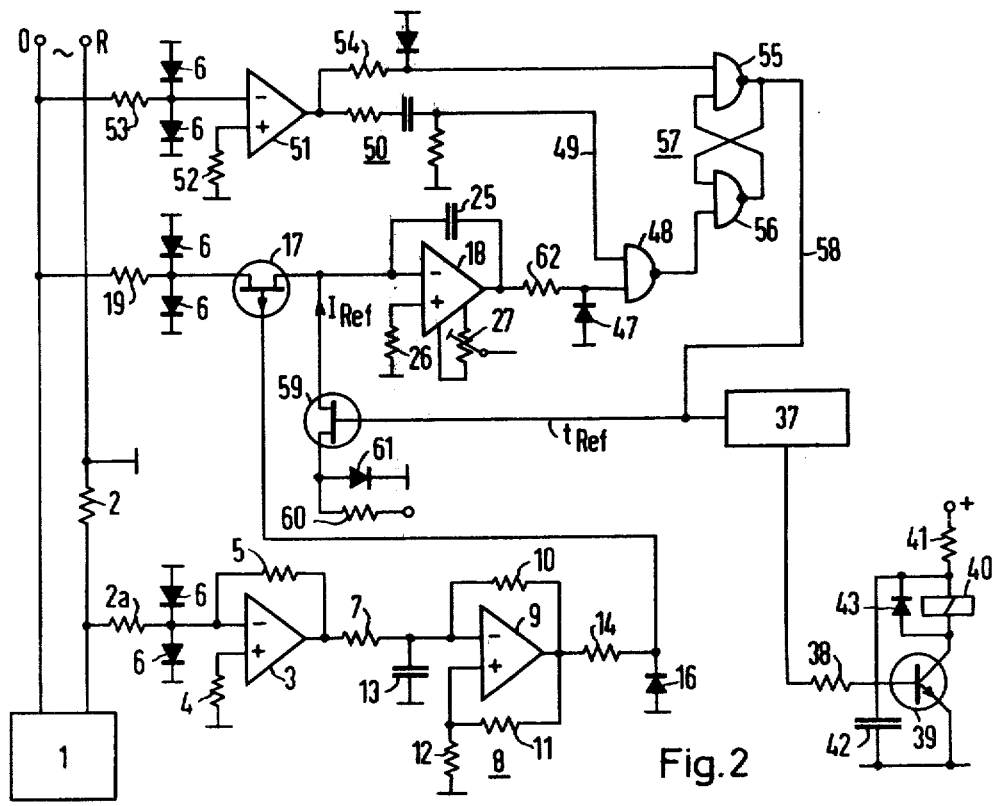
FIG. 2 shows a circuit diagram of an electronic kilowatt-hour meter, in which an integrator operating according to the principle of charge compensation is used.

FIG. 2 shows an embodiment of the present invention with an integrator that works according to the principle of charge compensation. In FIG. 2 functionally like parts are provided with the same reference numerals as in the embodiment according to FIG. 1. In this embodiment also, a load current is conducted through a shunt 2, and the voltage drop at this shunt is used as the variable proportional to the load current. This voltage drop is amplified by means of an operational amplifier 3 and fed to an oscillator 8 having the output characteristics of in astable multivibrator. The output of the oscillator 8 is connected via a resistor 14 and a diode 16 directly to the gate of a p-channel field-effect transistor 17. The field-effect transistor 17 switches a current directly proportional to the load current via a resistor 19 to the inverting input of an integrating amplifier 18 which is connected in the same manner as in the embodiment according to FIG. 1. The output of the integrating amplifier 18 is connected via a resistor 62 and a diode 47 to the input of a NAND gate 48. The other input of the NAND gate 48 is connected via a line 49 and a differentiating member 50 to the output of a switching amplifier 51, the noninverting input of which is tied to reference potential via a resistor 52. The inverting input of the switching amplifier 51 is connected via a high resistance 53 to the neutral conductor of the voltage source. Diodes 6 serve to limit the voltage. The output of the switching amplifier 51 is furthermore connected via a resistor 54 to the input of a flip flop 57 which consists of two cross coupled NAND gates 55 and 56. The output of the NAND gate 48 is connected to the one input of the NAND gate 56 of the flip-flop 57. The line 58, which is connected to the output of the bistable switching member 57, is connected, on one hand, to a stepdown stage 37 and, on the other hand, to a p-channel field-effect transistor 59, via which a reference current $I_{Ref}$ can be fed to the inverting input of the integrating amplifier 18. A constant-voltage source is indicated with a + and the source supplies the reference current $I_{Ref}$ via a resistor 60. A diode 61 limits the current.

The operation of the circuit arrangement according to FIG. 2 is as follows: As in the embodiment according to FIG. 1, the p-channel field-effect transistor 17 is switched open and closed in accordance with the duty cycle of the signals delivered by the oscillator 8. In a similar manner, a current proportional to the load voltage is fed via the resistor 19 to the inverting input of the integrating amplifier 18. Thereby, the capacitor 26 is continuously charged. If the voltage at the capacitor 25 or the resistor 62, respectively, reaches the input threshold value of the NAND gate 48, then when a brief "1" signal is given via the differentiating member 50 at the rising edge of the signal delivered at the output of the switching amplifier 51, the "1" signal normally at the output of NAND gate 48 changes to a "0". Thereby, the "0" signal at the output of the NAND gate 56 disappears and "1" signal appears, so that both inputs of the NAND gate 55 are at "1". Therewith, the output of the gate 55 changes from "1" to "0". As a result the p-channel field effect transistor 59 is closed via the line 58 and the reference current $I_{Ref}$ flows into the inverting input of the integrating amplifier 18, to cause a corresponding discharge of the integrating capacitor 25. This makes the output of the integrating amplifier immediately drop below the threshold value of the NAND gate 48 again and, since a "0" signal is also present at the other input of this gate, a "1" signal is again produced at the output of the NAND gate 48, which, however, changes nothing at the output of the NAND gate 56. With the falling pulse edge, however, the input of NAND gate 55 connected via the resistor 54 gets a "0" signal, so that, at the output of this gate, a "1" signal is again present which cuts off the reference current via the field effect transistor 59. At the same time, the second input of the NAND gate 56 also gets a "1" signal, so that a "0" signal appears at the output thereof, which is fed to the other input of the NAND gate 55. With the next signal change at the output of the switching amplifier 51, the flip-flop 57 therefore cannot respond. Since the switching amplifier 51 delivers square pulses of 20 milliseconds corresponding to the frequency of the A-C current, exactly 10 milliseconds are taken out by the bistable switching member 57. The discharging process of the capacitor 25 then lasts exactly 10 milliseconds corresponding to the time base. As the time base is derived from the 50 Hz line frequency, the error of the frequency dependence is proportional to the frequency change.

This disadvantage can be eliminated by letting the time base be formed by an accurate timing device, e.g., a quartz crystal.

The meters shown in FIGS. 1 and 2 can be constructed from inexpensive, commercially available operational amplifiers, so that no custom-made integrated circuit need to be developed for realizing a cost-effective electronic household meter.

What is claimed is:

1. In an apparatus for measuring the energy consumption in an A-C network comprising a shunt coupled in series with the load for deriving a voltage proportional to load current; means for deriving a quantity proportional to voltage; a solid state switch coupled to be controlled by the voltage output from said shunt having as an input said quantity porportional to load voltage; integrating means having its input coupled to the output of said solid state switch; and a limit stage having its input coupled to the output of said amplifier, the improvement comprising:
   (a) a first operational amplifier having as an input the voltage drop across said shunt and developing an output current;
   (b) a second operational amplifier coupled to have the output characteristics of an astable multivibrator having;
      (i) a first resistor coupling the output of said first operational amplifier to the input of said second operational amplifier;
      (ii) a capacitor between the inverting input of said second operational amplifier and ground;
      (iii) a second resistor coupling the output of said operational amplifier to its inverting input;
      (iv) a third resistor coupling the output of said operational amplifier to its non-inverting input; and
      (v) a fourth resistor coupling the noninverting input of said second amplifier to ground; and
   (c) said means for integrating comprising a third operational amplifier having capacitive feedback.

2. The improvement according to claim 1 wherein said means for deriving the quantity proportional to the load voltage comprise:
   a resistor, one end of which is connected to one conductor supplying the load and the other end of which is coupled to said solid state switch, the output of said switch coupled to the inverting input of said means for integrating.

3. The improvement according to claim 2 further comprising:
   means for inverting the quantity proportional to the load voltage, to obtain an inverted quantity;
   means for halving the inverted quantity to obtain a halved inverted quantity; and
   means for conducting said halved inverted quantity to the inverting input of said means for integrating.

4. The improvement according to claim 3 and further including:
   a pulse step-down stage coupled to the output of said limit stage; and
   a pulse counter coupled to the output of said pulse step-down stage.

5. The improvement according to claim 4 and further comprising:
   an Exclusive-OR gate interposed between said oscillator and said solid state switch, said Exclusive-OR gate having as a second input the output of said limit stage whereby said integrating amplifier will operate according to the principle of capacitor charge reversal.

6. The improvement according to claim 5 wherein said solid state switch is controlled directly by said osicillator, whereby said integrating amplifier will operate according to the principle of charge compensation.

7. The improvement according to claim 6 and further comprising:
   a reference current source;
   a time base developing outputs representing the beginning and end of a reference time period;
   means controlled by the outputs of said time base and by said limit stage for coupling said current source to the inverting input of said integrating amplifier in response to the beginning of said reference time period, when a signal from said limit stage is also present, until the end of said reference time period.

8. The improvement according to claim 7 wherein said time base comprises means deriving said outputs from the line frequency and said means controlled by said outputs comprise a flip-flop having said outputs as inputs and a second solid state switch having the output of said flip-flop as a control input.

9. The improvement according to claim 8 wherein said first solid state switch and said second solid state switch comprise p-channel field-effect transistors.

10. The improvement according to claim 9 wherein said means for deriving include:
- a differentiating member coupled to the line frequency, and wherein said limit stage comprises:
- a NAND gate, one input of which is coupled to the output of said differentiating member, and
- a second resistor coupling the output of said integrating amplifier to the other input of said NAND gate.

* * * * *